(12) United States Patent
Haddadin et al.

(10) Patent No.: US 9,344,122 B1
(45) Date of Patent: *May 17, 2016

(54) ADAPTIVE FILTERING FOR CANCELING DISTORTION IN RADIO FREQUENCY SIGNALS

(71) Applicant: L-3 COMMUNICATIONS CORP., New York, NY (US)

(72) Inventors: Osama S. Haddadin, Salt Lake City, UT (US); Roy E. Prymek, West Jordon, UT (US); William K. McIntire, Sandy, UT (US)

(73) Assignee: L-3 Communications Corp., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/465,498

(22) Filed: Aug. 21, 2014

Related U.S. Application Data

(62) Division of application No. 13/533,012, filed on Jun. 26, 2012, now Pat. No. 8,879,663.

(51) Int. Cl.

| H04B 1/10 | (2006.01) |
|---|---|
| H04B 1/52 | (2015.01) |
| H04B 1/525 | (2015.01) |
| H04B 1/04 | (2006.01) |
| H04L 25/03 | (2006.01) |

(52) U.S. Cl.
CPC ............. *H04B 1/10* (2013.01); *H04B 1/0475* (2013.01); *H04B 1/525* (2013.01); *H04L 25/03019* (2013.01)

(58) Field of Classification Search
CPC .................. H04L 25/03038; H04L 25/03019; H04B 1/126; H04B 2001/1045; H04B 1/525; H04B 1/0475; H04B 1/10
See application file for complete search history.

(56) References Cited

U.S. PATENT DOCUMENTS

| 5,095,536 | A | 3/1992 | Loper |
|---|---|---|---|
| 7,127,211 | B2 | 10/2006 | Hildebrand et al. |
| 7,346,134 | B2 | 3/2008 | Smith |
| 7,469,491 | B2 | 12/2008 | McCallister et al. |
| 8,370,349 | B2 | 2/2013 | Quoc et al. |
| 8,780,963 | B1 | 7/2014 | Haddadin |
| 2001/0005402 | A1 | 6/2001 | Negatani et al. |
| 2004/0203458 | A1 | 10/2004 | Nigra |
| 2006/0007492 | A1 | 1/2006 | Herron et al. |
| 2006/0139089 | A1 | 6/2006 | Bambridge et al. |
| 2007/0184782 | A1 | 8/2007 | Sahota et al. |

(Continued)

OTHER PUBLICATIONS

Drumright, "Adaptive Filtering," Spring 1998 (35 Pages).*

(Continued)

*Primary Examiner* — Chieh M Fan
*Assistant Examiner* — Michelle M Koeth
(74) *Attorney, Agent, or Firm* — Brian Tucker; Kirton McConkie

(57) ABSTRACT

Adaptive filtering is used to substantially cancel distortion in radio frequency (RF) signals. Such adaptive filtering can be used in an RF transmitting module to pre-compensate an RF signal with compensation (inverse) distortion to cancel inherent transmission path distortion from the RF signal. Adaptive filtering can also be used in a multi-carrier RF receiving module to cancel from a given carrier signal distortion due to cross talk from adjacent carrier signals. Adaptive filtering in an RF transceiver can be used to cancel from a received RF signal distortion arising from leakage of a transmit signal into the receive path.

14 Claims, 9 Drawing Sheets

(56) References Cited

U.S. PATENT DOCUMENTS

| | | |
|---|---|---|
| 2008/0232268 A1 | 9/2008 | Kahrizi et al. |
| 2010/0124289 A1 | 5/2010 | Yonge et al. |
| 2010/0183106 A1* | 7/2010 | Beidas et al. ............ 375/350 |
| 2010/0217587 A1* | 8/2010 | Sato et al. ............... 704/226 |
| 2010/0329401 A1 | 12/2010 | Terry |
| 2011/0025414 A1 | 2/2011 | Wolf et al. |
| 2011/0254624 A1 | 10/2011 | Onishi |
| 2012/0027141 A1* | 2/2012 | Petrovic et al. ......... 375/350 |
| 2013/0346006 A1* | 12/2013 | Noga ....................... 702/70 |

OTHER PUBLICATIONS

U.S. Appl. No. 13/533,012, filed Jun. 26, 2012, Haddadin et al.

Sameric et al., "Adaptive Cancellation of Intermodulation Distortion," Presentation of Senior Thesis, the University of Utah (Apr. 2010), 96 pages.

Davis et al., "Adaptive Cancellation of Intermodulation Distortion," Senior Thesis, the University of Utah (Apr. 9, 2010), pp. 1-18.

Yuanming et al., "Adaptive Nonlinearity Compensation for Power Amplifiers Based on Local-Modeling Approach," Proceedings of the 26$^{th}$ Chinese Control Conference (Jul. 2007), pp. 159-163.

\* cited by examiner

ADAPTIVE FILTERING FOR CANCELING DISTORTION IN RADIO FREQUENCY SIGNALS

CROSS REFERENCE TO RELATED APPLICATION(S)

This application is a division of U.S. patent application Ser. No. 13/533,012 (filed Jun. 26, 2012) (pending), which is incorporated herein by reference in its entirety. This application is also related to U.S. Pat. No. 8,780,963, which is commonly owned and discloses and claims related subject matter.

BACKGROUND

Information (e.g., analog electrical signals, digital data, or the like) can be transmitted by modulating the information onto an RF carrier signal and then transmitting the modulated carrier signal from an RF transmitter. An RF receiver can receive the transmitted modulated carrier signal and demodulate the carrier signal and thereby obtain the information. Various types of distortion can affect the transmitted and received signals. For example, linear and non-linear distortion can be introduced in the transmitter and/or the transmitting antenna. Linear and non-linear distortion can also affect the transmitted signal as the signal travels from the transmitter to the receiver. As another example, in a device for transmitting and/or receiving multiple RF carrier signals, each carrier signal can be distorted by cross talk from adjacent carrier signals. As yet another example, in a transceiver (which is a device that both transmits and receives RF signals), a signal from the transmit path that is being prepared for transmission from the transceiver can leak into a signal received at the transceiver. Embodiments of the present invention address these and other distortion in transmitted and/or received RF signals.

SUMMARY

In some embodiments, an RF receiving module can include an RF receiver, RF channels, a first adaptive filter, and a first subtractor. The RF receiver can be configured to receive a multicarrier RF signal, which can include carrier signals each having a frequency within a different frequency pass-band. The RF channels can each be configured for one of the carrier signals. The first adaptive filter can be configured to filter, in accordance with a first variable filtering characteristic, a first of the carrier signals in a first one of the RF channels, and the first subtractor can be configured to subtract an output of the first adaptive filter from a second of the carrier signals in a second of the RF channels.

In some embodiments, a process of cancelling cross-talk distortion from a carrier signal in an RF receiving module can include receiving a multicarrier RF signal, which can include carrier signals each having a frequency within a different frequency pass-band. The process can also include separating the multicarrier RF signal into the carrier signals. The process can also include filtering, with a first adaptive filter, a first of the carrier signals, and the process can include subtracting an output of the first adaptive filter from a second of the carrier signals.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

As used herein, an "adaptive filter" is a digital filter that includes a control input and an adaptive algorithm that changes the filtering characteristics (e.g., by changing the filtering coefficients) of the adaptive filter in accordance with the control input. The filtering characteristics of an adaptive filter can thus be changed in accordance with the control input. Examples of suitable adaptive algorithms include without limitation least mean square (LMS) algorithms, recursive least square (RLS) algorithms, adaptive lattice algorithms, decision directed mean squared error algorithms, or the like. As used herein, an adaptive filter can perform linear and/or non-linear filtering.

As used herein, "inverse distortion" combines with "distortion" to substantially eliminate the distortion. Also as used herein, "compensation distortion" is "inverse distortion."

As used herein, "inherent path distortion" refers to distortion to a radio frequency (RF) signal due to the inherent operating characteristics of an RF transmission path.

Figure 7:
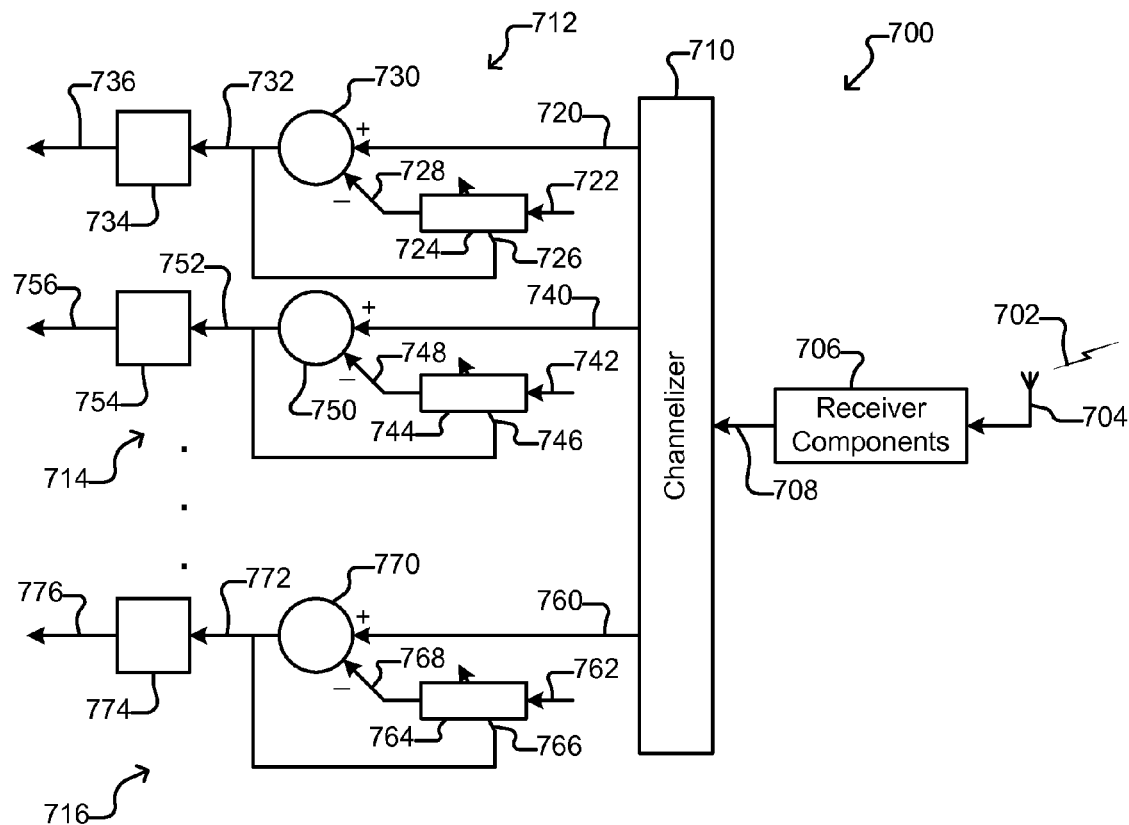
FIG. 7 illustrates an example of a multi-carrier RF receiving module that uses adaptive filtering to cancel from a given carrier signal distortion due to cross talk from adjacent carrier signals according to some embodiments of the invention.
Figure 8:
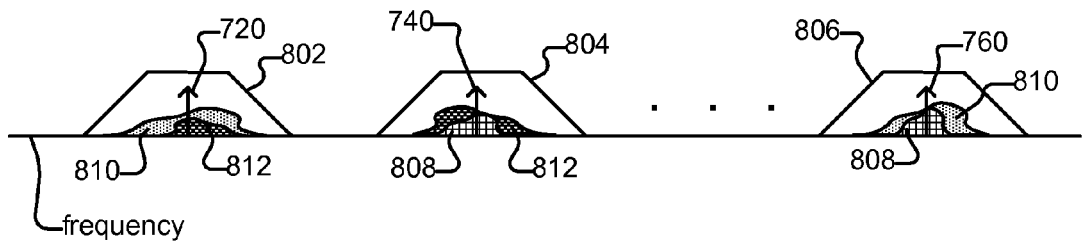
FIG. 8 illustrates examples of frequency pass-bands of carrier signals and in-band distortion according to some embodiments of the invention.
Figure 9:
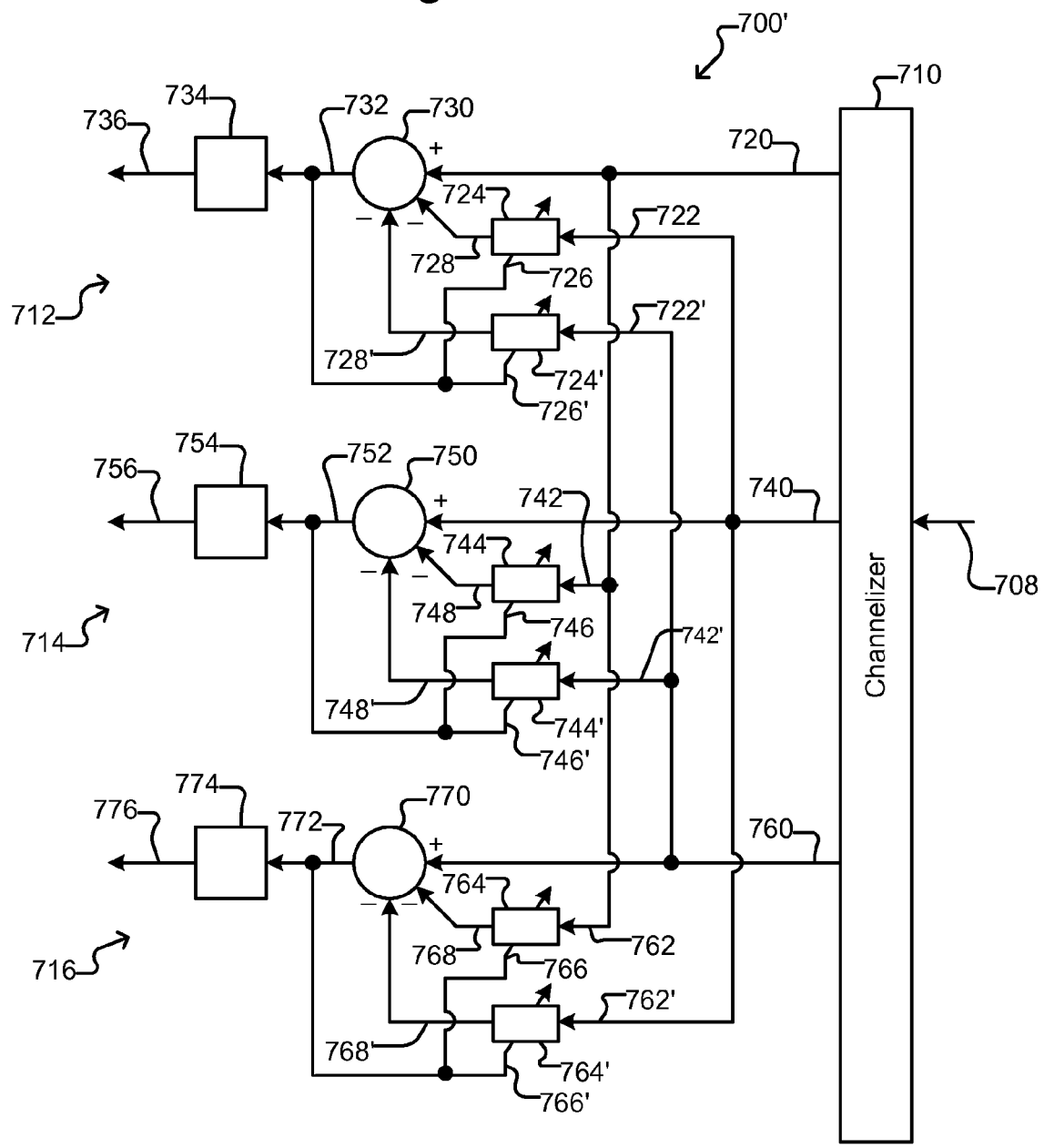
FIG. 9 shows an example of the multi-carrier RF receiving module of FIG. 7 configured for three carrier signals according to some embodiments of the invention.

In some embodiments of the invention, adaptive filtering can be used to substantially cancel distortion in radio frequency (RF) signals. FIGS. 1-6 illustrate embodiments of the invention in which adaptive filtering is used in an RF transmitting module to pre-compensate an RF signal with compensation (inverse) distortion to cancel inherent transmission path distortion from the RF signal. FIGS. 7-9 illustrate embodiments of the invention in which adaptive filtering in a multi-carrier RF receiving module is used to cancel from a given carrier signal distortion due to cross talk from adjacent carrier signals. FIGS. 10-13 show embodiments of the invention in which adaptive filtering in an RF transceiver is used to cancel from a received RF signal distortion arising from leakage of a transmit signal into the receive path. FIG. 14 illustrates an embodiment of the invention in which the foregoing uses of adaptive filtering to cancel distortion are implemented in an RF transceiver.

Figure 1:
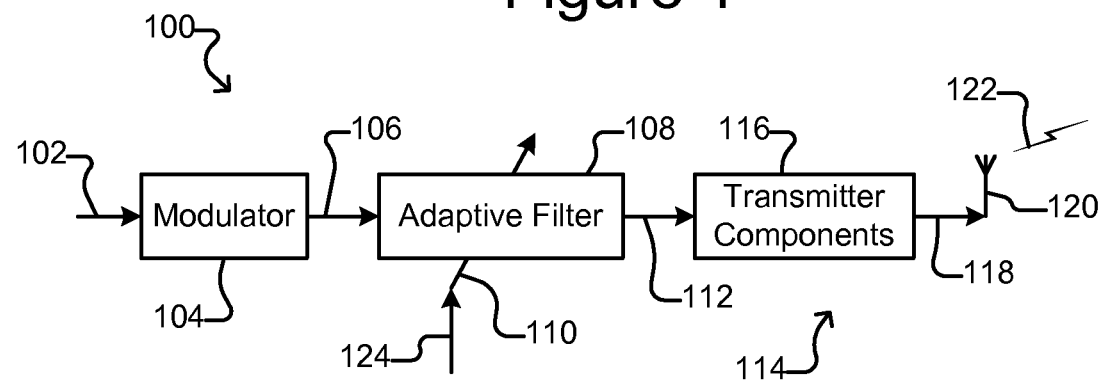
FIG. 1 illustrates an example of an RF transmitting module that uses adaptive filtering to pre-compensate an RF signal to cancel transmission path distortion from the RF signal according to some embodiments of the invention.

Turning first to FIG. 1, it is noted that FIG. 1 illustrates an embodiment of the invention in which adaptive filter is used in an RF transmitting module to pre-compensate an RF signal with compensation (inverse) distortion to cancel inherent transmission path distortion from the RF signal. As shown, the transmitting module 100 of FIG. 1 can include a modulator 104, an adaptive filter 108, and a transmission path 114, which can include transmitter components 116 and a transmitting mechanism 120. The transmitting module 100 can be part of an RF transmitting device or an RF transceiver.

The modulator 104 can receive data 102 as input and modulate the data 102 onto a carrier signal such as is known in the field. The modulator 104 can thus output a modulated carrier signal 106. The data 102 can be digital data, and the carrier signal can be a periodic RF signal suitable for transmission. Alternatively, the data 102 can be in the form of an analog signal. Regardless, the modulator 104 can use any suitable form of modulation including without limitation amplitude modulation, frequency modulation, pulse code modulation, phase shift modulation, or the like.

As noted, the transmission path 114 can comprise transmitter components 116 and a transmitting mechanism 120. An RF signal (e.g., signal 112) directed through the transmission path 114 can be radiated by the transmitting mechanism 120 as a transmitted signal 122 into a transmission medium where it can be received by an RF receiving device (not shown in FIG. 1). The transmitter components 116 can include any of several electronic hardware and/or software components for processing an RF signal for transmission by the transmitting mechanism 120. For example, the transmitter components 116 can include such elements as one or more digital-to-analog converters, up converters, power amplifiers, and/or filters (e.g., band-pass filters). The transmission medium into which the transmitted signal 122 is transmitted can be any suitable medium for RF signals. For example, the transmission medium can be free space, ambient air, a cable, a telephone line, a fiber optic cable, or the like. The transmitting mechanism 120 can be any mechanism suitable for transmitting the RF signal into the transmission medium. For example, the transmitting mechanism 120 can be an RF antenna, a modem (e.g., a cable modem, a telephone line modem, a fiber optic modem), or the like.

The transmitting module 100 can distort RF signals such that the transmitted RF signal 122 is distorted. The transmission path 114, for example, can introduce distortion into the signal 112, and the distortion can be linear and/or non-linear. The transmitted signal 122 can thus be a distorted version of signal 112. For example, one or more of the transmitter components 116 (e.g., the power amplifier) can introduce linear and/or non-linear distortion into the signal 112. As another example, the transmitting mechanism 120 can introduce linear and/or non-linear distortion into the signal 112. The transmitted signal 122 can thus include linear and/or non-linear distortion caused by one or more of the transmitter components 116 and/or the transmitting mechanism 120. The distortion introduced into the RF signal by the transmission path 114 is sometimes termed "inherent path distortion" herein.

As mentioned, the transmitter components 116 can include one or more filters, which can include a band-pass filter (not shown) that substantially filters out (i.e., removes) frequencies outside the pass-band of the band-pass filter and thus passes substantially only frequencies within the pass-band of the band-pass filter (not shown). Such a band-pass filter (not shown) can thus substantially cancel distortion with frequencies outside the pass-band of the filter (not shown), and the transmitted signal 122 can thus be substantially free of distortion with frequencies outside the pass-band of any band-pass filters (not shown) in the transmitter components 116.

Any such band-pass filters (not shown) in the transmitter components 116 will not, however, cancel distortion with frequencies that are within the pass-band of the band-pass filters (not shown) in the transmitter components 116. Distortion within the pass-band are sometimes referred to herein as "in-band distortion." Nor will such band-pass filters (not shown) in the transmitter components 116 cancel even distortion with frequencies outside of the pass-band of the band-pass filters (not shown) caused by the transmitting mechanism 120 and/or the transmission medium into which the transmitted signal 122 is transmitted. The transmitted signal 122 can thus include both in-band and out-of-band distortion.

Figure 2:
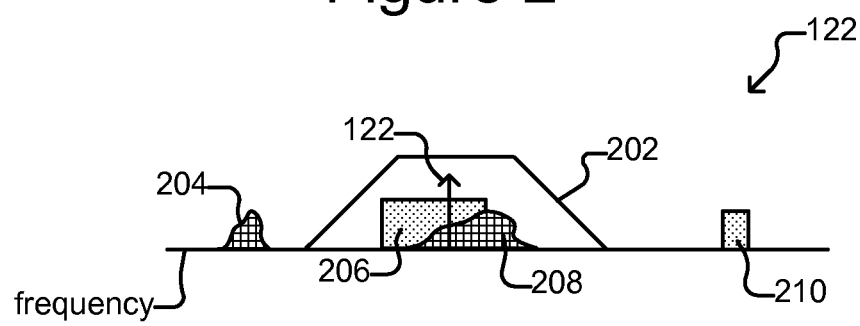
FIG. 2 illustrates an example of a frequency pass-band of the RF transmitting module of FIG. 1 and distortion inside and outside of the pass-band.

An example is illustrated in FIG. 2, in which element 202 represents the pass-band of band-pass filtering components (not shown) in the transmitter components 116 of FIG. 1. Element 206 represents in-band linear distortion with a frequency or frequencies inside the pass-band 202, and element 208 represents in-band non-linear distortion with a frequency or frequencies inside the pass-band 202. Distortion 206 and 208 can be introduced, for example, by one or more of the transmitter components 116 and/or the transmitting mechanism 120. Elements 204 and 210 represent non-linear and linear distortion, respectively, with frequencies outside the pass-band 202 introduced by the transmitting mechanism 120. As noted, in-band distortion 206 and 208 will typically not be canceled by band-pass filtering in the transmitter components 116, and even out-of-band distortion 204 and 210 introduced after the transmitter components 116 (e.g., by the transmitting mechanism 120) will typically not be removed by band-pass filtering in the transmitter components 116. Distortion 204, 206, 208, and/or 210—which can be examples of components of the inherent path distortion of the transmission path 114—can thus typically be part of the transmitted signal 122.

Referring again to FIG. 1, the adaptive filter 108 can be configured to pre-compensate the modulated carrier signal 106 with the substantial inverse of some, most, or substantially all of the inherent path distortion introduced into the transmitted signal 122 by the transmission path 114 and/or other sources of distortion. The adaptive filter 108 can thus distort the modulated carrier signal 106 with compensation distortion, which can be the substantial inverse of the inherent path distortion introduced by the transmission path 114 and/or other sources of distortion of the transmitted signal 122. Referring to the example illustrated in FIG. 2, the adaptive filter 108 can be configured to introduce into the modulated carrier signal 106 the inverse distortion of distortion 204, 206, 208, and/or 210. The pre-compensated modulated carrier signal 112 output by the adaptive filter 108 can thus include pre-compensation distortion that is the inverse of distortion 204, 206, 208, and/or 210 in the example in FIG. 2.

In accordance with the definition of "adaptive filter" above, the adaptive filter 108 filters the modulated carrier signal 106 in accordance with the filtering characteristics (e.g., filter coefficients) of the adaptive filter 108, and control input 110 can vary the filtering characteristics (e.g., filter coefficients) in accordance with an adaptive algorithm of the adaptive filter 108. One or more control signals 124 (which can comprise one or more input signals) can be provided to the control input 110 to vary the filtering characteristics of the adaptive filter 108 to impart the compensation distortion to the signal 112. For example, one or more control signals 124 can be provided to the control input 110 so that the adaptive filter 108 introduces compensation distortion into the pre-compensated signal 112 that is the inverse distortion of one or more of distortion 204, 206, 208, and/or 210 in FIG. 2. Thus, as the pre-compensated signal 112 passes through the transmission path 114, the inherent path distortion (e.g., 204, 206, 208, and/or 210) of the transmission path 114 can be canceled by the pre-compensation distortion introduced into the pre-compensated signal 112, and the transmitted signal 122 will be substantially free of such distortion.

In some embodiments, the control signal 124 can be proportional to or a function of a distorted version of the transmitted signal 122 distorted with the inherent path distortion of the transmission path 114. The control signal 124 can be provided to the control input 110 of the adaptive filter 108, which can be configured to drive the pre-compensated signal 112 to impart inverse distortion to the pre-compensated signal 112 that is the inverse of the inherent path distortion imparted by the transmission path 114. More generally stated, the adaptive algorithm of the adaptive filter 108 can be configured to drive the output signal 112 to correspond to the control signal 124 or one or more features of the control signal 124.

Figure 3:
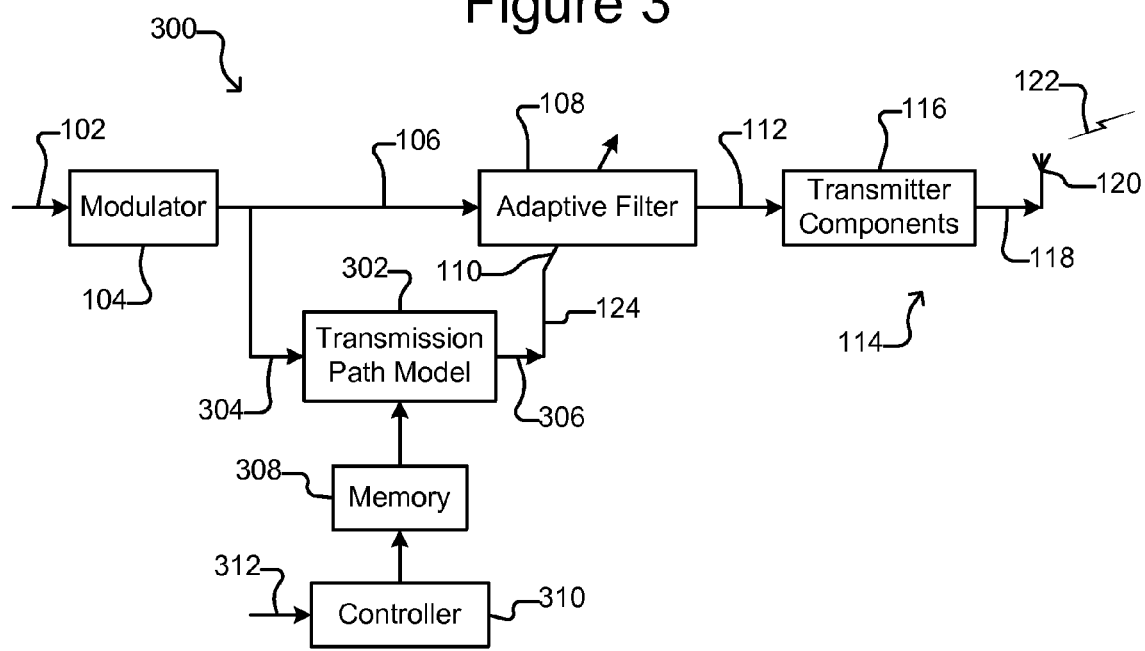
FIG. 3 illustrates an example of the RF transmitting module of FIG. 1 in which the control signal that controls the adaptive filter is provided by a model of the transmission path of the RF transmitting module according to some embodiments of the invention.

In some embodiments, the control signal 124 provided to the control input 110 of the adaptive filter 108 can be an estimated or approximated version of the modulated carrier signal 106 distorted with the inherent path distortion of the transmission path 114. FIG. 3 illustrates an example 300 of the transmitting module 100 of FIG. 1 that includes a transmission path model 302 that is a model of all or part of the transmission path 114 according to some embodiments of the invention. The transmitting module 300 of FIG. 3 thus represents on example configuration of the transmitting module 100 of FIG. 1 in which the control signal 124 is provided by a transmission path model 302 of all or part of the transmission path 114.

As shown in FIG. 3, the modulated carrier signal 106 can be provided to an input 304 of the transmission path model 302. As noted, the transmission path model 302 can model all or part of the transmission path 114, which can thus provide at its output 306 a signal that approximates a version of the modulated carrier signal 106 distorted with the inherent path distortion of the transmission path 114. That is, the transmission path model 302 can be configured to distort the modulated carrier signal 106 approximately the same as the transmission path 114 distorts the signal 112. The adaptive algorithm of the adaptive filter 108 can be configured to change the filtering characteristics of the adaptive filter 108 in accordance with the control signal 124 to drive the signal 112 to the inverse distortion of the inherent path distortion of the transmission path 114. This can result, for example, in the signal 112 output by the adaptive filter 108 being the modulated carrier signal 106 with compensation distortion that is the inverse of the distortion of the inherent path distortion of the transmission path 114.

The transmission path model 302 can be a digital representation of all or part of the transmission path 114, and the transmission path model 302 can be obtained in any suitable fashion. For example, the transmission path model 302 can be a computer-generated model of the transmission path 114. As another example, the transmission path model 302 can be obtained from tests of the transmission path 114 in a laboratory. Regardless, the transmission path model 302 can model both linear and non-linear characteristics of the transmission path 114.

As shown in FIG. 3, the transmitting module 300 can also include an electronic memory 308 (e.g., a digital storage device) and an electronic controller 310 (e.g., a digital processor, computer, or the like). Multiple versions of the transmission path model 302 can be stored in the memory 308, and the controller 310 can select any of the versions of the transmission path model 302 for use at any given time during operation of the transmitting module 300. For example, each version of the transmission path model 302 stored in the memory 308 can correspond to a different operating condition or combination of conditions of the transmitting module 300, and the controller 310 can be configured to select and change, as needed, the version of the transmission path model 302 in memory 308 in accordance with the current and changing condition(s) of the transmitting module 300. The controller 310 can thus change the version of the transmission path model 302 used to generated control signal 124 based on changing conditions of the transmitting module 300. An input 312 of the controller 310 can be connected, for example, to a sensor (not shown) that senses current condition(s) of the transmitting module 300. Alternatively or in addition, the input 312 can allow a human operator to control the controller 310.

As just one example, each version of the transmission path model 302 stored in the memory 308 can correspond to a different operating temperature of the transmission path 114. A temperature sensing device (not shown) for sensing the operating temperature of the transmission path 114 can be connected to the control input 312 of the controller 310. The controller 310 can be configured to select the version of the transmission path model 302 from the memory 308 that corresponds to the current operating temperature, and the controller 310 can be further configured to change the selected version of the transmission path model 302 as the operating temperature changes.

Figure 4:
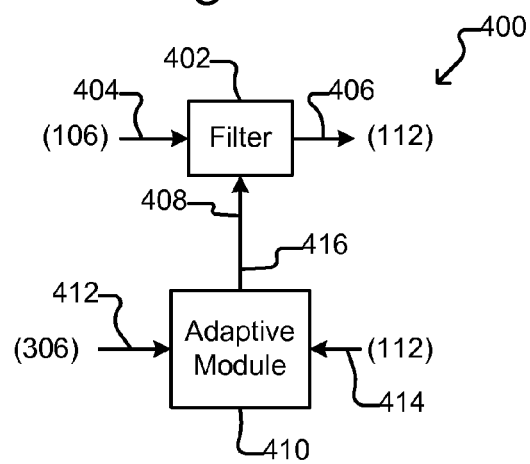
FIG. 4 illustrates an example of a configuration of the adaptive filter of FIG. 3 according to some embodiments of the invention.

FIG. 4 illustrates an example configuration 400 of the adaptive filter 108. As shown, the configuration 400 of the adaptive filter 108 illustrated in FIG. 4 can include a controllable filter 402 and an adaptive module 410. The controllable filter 402 can include an input 404, an output 406, and a control input 408. The controllable filter 402 receives data at input 404, filters the data in accordance with the control input 408, and outputs a filtered version of the data through output 406. The controllable filter 402 can be a linear filter, a non-linear filter, or a combination linear/non-linear filter.

The adaptive module 410 can implement the adaptive algorithm of the adaptive filter 400. As shown, the adaptive module 410 can include a desired signal input 412, an actual signal input 414, and an error output 416. The error output 416 can be a difference, or proportional or a function of the difference, between a signal at the actual signal input 414 and a signal at the desired signal input 412. The adaptive module 410 can be configured to implement any suitable adaptive algorithm including any of the adaptive algorithms identified above.

As noted, the configuration 400 shown in FIG. 4 is an example configuration of the adaptive filter 108 in FIG. 3, and the configuration 400 of the adaptive filter shown in FIG. 4 can thus replace the adaptive filter 108 in FIG. 3. The input 404 of the controllable filter 402 can be connected to the modulated signal 106, and the output 406 of the controllable filter 402 output the compensated signal 112 to the transmitter components 116. The desired signal input 412 of the adaptive module 410 can be connected to the output of the transmission path model 306, and the actual signal input 414 can be connected to the compensated signal 112. The error signal at the output 416 of the adaptive module 410, which is input into the control input 408 of the controllable filter 402, can control the controllable filter 402. The changing error signal at the output 416 can thus change the filter characteristics of the controllable filter 402 to drive the output 406—and thus the pre-compensated signal 112—to be similar to or the same as the output 306 of the transmission path model 302. Alternatively, the filtering characteristics of the controllable filter 402 and the adaptive algorithm of the adaptive module 410 can drive the output 406—and thus the pre-compensated signal 112—to be similar to or the same as a feature of the output 306 of the transmission path model 302.

Figure 5:
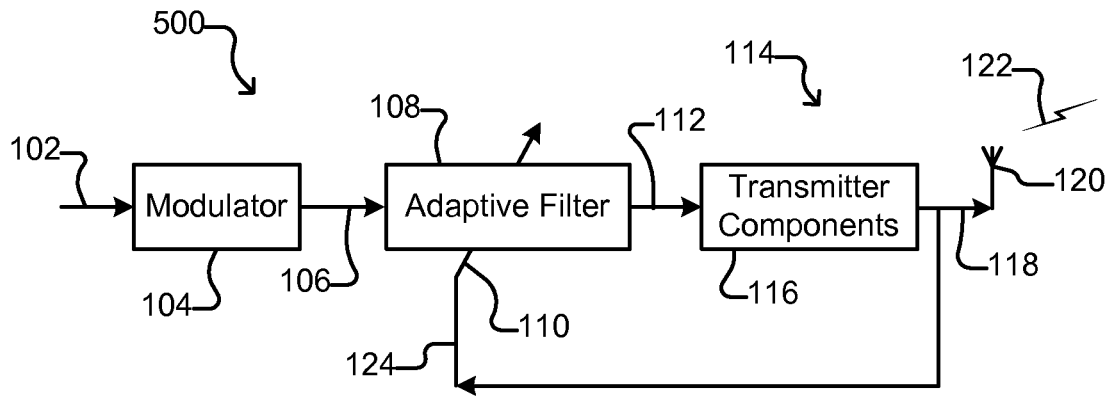
FIG. 5 illustrates another example of the RF transmitting module of FIG. 1 in which the control signal that controls the adaptive filter is a feedback signal from the transmission path of the RF transmitting module according to some embodiments of the invention.

FIG. 5 illustrates an example of the transmitting module 100 of FIG. 1 in which the signal 118 is fed back from the transmission path 114 as the control signal 124 to the control input 110 of the adaptive filter 108 according to some embodiments of the invention. The signal 118 fed back as shown in FIG. 5 is thus another example of a distorted version of the transmitted signal 122 that can be used as the control signal 124 provided to the input control 110 of the adaptive filter 108. The adaptive algorithm of the adaptive filter 108 can be configured to change the filtering coefficients of the adaptive filter 108, in accordance with the signal 118 fed back as the filter control signal 124, to drive the signal 112 such that the signal to be transmitted 118 corresponds to the modulated carrier signal 106. That is, the signal 112 is driven to include compensation distortion that is the inverse of the inherent path distortion of the transmission path 114.

Figure 6:
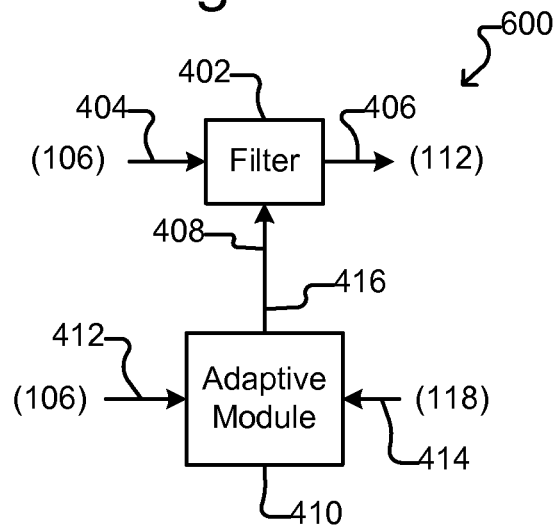
FIG. 6 illustrates an example of a configuration of the adaptive filter of FIG. 5 according to some embodiments of the invention.

FIG. 6 illustrates another example configuration 600 of the adaptive filter 108. As shown, the configuration 600 of the adaptive filter 108 illustrated in FIG. 6 can include the controllable filter 402 and adaptive module 410 shown in FIG. 4 and discussed above. The configuration 600 shown in FIG. 6 is an example configuration of the adaptive filter 108 in FIG. 5, and the configuration 600 of the adaptive filter shown in FIG. 6 can thus replace the adaptive filter 108 in FIG. 5.

The input 404 of the controllable filter 402 can be connected to the modulated signal 106, and the output 406 of the controllable filter 402 can output the compensated signal 112 to the transmitter components 116. The desired signal input 412 of the adaptive module 410 can be connected to the modulated signal 106, and the actual signal input 414 can be connected to the feedback of the signal 118 from the transmission path 114.

The error signal at the output 416 of the adaptive module 410, which is input into the control input 408 of the controllable filter 402, can control the controllable filter 402. The changing error signal at the output 416 can thus change the filter characteristics of the controllable filter 402 to drive the output 406—and thus the pre-compensated signal 112—so that the signal 118 is driven to be like the modulated carrier signal 106.

The examples illustrated in FIGS. 1-6 are examples only, and variations are possible. For example, FIGS. 1 and 3-6 show simplified block diagrams, and any of the transmitting modules 100, 300, and 500 can include additional circuitry, modules, or the like. Moreover, the transmitting modules 100, 300, and 500 need not include each of the elements illustrated in FIGS. 1 and 3-6. As another example, the carrier signal 106 can be a multi-carrier signal that is a combination of multiple modulated carrier signals each having a different frequency. It is also noted that each of the elements in FIGS. 1 and 3-6 can be implemented in hardware circuitry, software, or a combination of hardware and software.

Turning now to FIG. 7, it is noted that FIG. 7 illustrates an example of a multi-carrier RF receiving module 700 that uses adaptive filtering to cancel from a given carrier signal distortion due to cross talk from adjacent carrier signals. The module 700 can be part of an RF receiving device or an RF transceiver.

FIG. 7 illustrates a simplified block diagram of elements of an RF multi-carrier receiving module 700 configured to receive and process an incoming multi-carrier RF signal 702. As is known, a multi-carrier RF signal 702 can comprise a plurality of carrier signals each in a different frequency band. As shown, the RF receiving module 700 can include an RF receiving mechanism 704 for receiving the incoming multi-carrier signal 702 and receiver components 706 for processing the multi-carrier signal 702 and presenting a received multi-carrier signal 708 to a channelizer 710. The receiving mechanism 704 can be, for example, an RF antenna, a modem (e.g., a cable modem, a telephone line modem, a fiber optic modem), or the like. The receiving components 706 can include such elements as one or more analog-to-digital converters, digital-to-analog converters, decoders, down converters, filters (e.g., band-pass filters), amplifiers, or the like.

The channelizer 710 can separate the multi-carrier signal 708 from the receiver components 706 into the individual carrier signals. For example, the channelizer 710 can include multiple band-pass filters (not shown) each of which passes a band of frequencies that includes one of the carrier signals but not the other carrier signals. The channelizer 710 can output each of the separated carriers signals into one of a plurality of signal channels 712, 714, and 716.

In the example illustrated in FIG. 7, there are i number of the channels 712, 714, and 716. In FIG. 7, element 712 represents a first channel, element 714 represents a second channel, and element 716 represents the ith channel. Although not shown, there can be i minus 3 number of channels between the second channel 714 and the ith channel 716. The incoming multi-carrier signal 702 can thus comprise as many as i number of carrier signals.

The channelizer 710 can separate the multi-carrier signal 708 into each of its individual carrier signals. Illustrated in FIG. 7 is a first carrier signal 720, a second carrier signal 740, and an ith carrier signal 760. Although not shown, there can be i minus 3 number of carrier signals between the second carrier signal 740 and the ith carrier signal 760. As shown in FIG. 7, each channel 712, 714, and 716 can include a demodulator 734, 754, 774 configured to demodulate the carrier signal in the channel 712, 714, and 716.

As is known, although the frequencies of the carrier signals 720, 740, and 760 of the multi-carrier signal 702 are in separated frequency bands, each of the carrier signals 720, 740, and 760 can include distortion in the form of cross-talk from one or more of the other carrier signals 720, 740, and 760. This can be referred to as cross talk distortion. An example is illustrated in FIG. 8.

Element 802 in FIG. 8 illustrates the pass-band 802 of the first carrier signal 720. Element 804 similarly represents the pass-band 804 of the second carrier signal 740, and element 806 represents the pass-band of the ith carrier signal 760. As noted, due to cross-talk between the carrier signals 720, 740, 760, each carrier signal 720, 740, 760 can include cross talk distortion in the form of cross talk from the other carrier signals 720, 740, 760.

Thus, as illustrated in FIG. 8, the first carrier signal 720 can include distortion 810 arising from all or part of the second carrier signal 740 leaking into the carrier signal 720 due to cross talk. As also illustrated, the first carrier signal 720 can also include distortion 812 arising from all or part of the ith carrier signal 760 leaking into the first carrier signal 720 due to cross talk. As shown, such distortion 810, 812 can include components with frequencies in the pass-band 802 of the first carrier signal 720. Moreover, such distortion 810, 812 can be linear or non-linear or a combination of linear and non-linear distortion. FIG. 8 also illustrates the second carrier signal 740 with distortion 808 arising from all or part of the first carrier signal 720 leaking into the second carrier signal 740 due to cross talk and with distortion 812 from the ith carrier signal 760 leaking in whole or part into the second carrier signal 740 as generally discussed above. As shown, such distortion 808, 812 can include components with frequencies in the pass-band 804 of the second carrier signal 740. The ith carrier signal 720 is also illustrated with distortion 808 from the first carrier signal 720 leaking in whole or part into the ith carrier signal 760 as generally discussed above and with distortion 810 from the second carrier signal 740 leaking in whole or part into the ith carrier signal 760 also as generally discussed above. As shown, such distortion 808, 810 can include components with frequencies in the pass-band 806 of the ith carrier signal 760.

As shown in FIG. 7, the multi-carrier receiving module 700 can include in each of the channels 712, 714, 716 a subtractor 730, 750, 770 and one or more adaptive filters 724, 744, 764 configured in an adaptive noise cancellation configuration to substantially cancel the cross talk distortion 808, 810, 812 from the carrier signals 720, 740, 760.

For example, the first channel 712 can include a subtractor 730 and at least one adaptive filter 724. Distortion (e.g., 810, 812) in the first carrier signal 720 from cross talk from another one of the carrier signals (e.g., the first carrier signal 740 or the second carrier signal 760) can be canceled from the first carrier signal 720 by connecting the other one of the carrier signals to the input 722 of the adaptive filter 724 and then subtracting (in the subtractor 730) the output 728 of the adaptive filter 724 from the first carrier signal 720 as shown in FIG. 7. As also shown, the output 732 of the subtractor 730 can be fed back to the control input 726 of the adaptive filter 724. The adaptive algorithm of the adaptive filter 724 can tend to cancel the distortion in the first carrier signal 720 that are due to cross talk from the carrier signal connected to the input 722 of the adaptive filter 724. Suitable adaptive algorithms for doing so include those identified above. The distortion in the first carrier signal 720 due to cross talk from one of the other carrier signals can thus be canceled from the first carrier signal 720. The output 732 of the subtractor 730 can thus be the first carrier signal 720 with such cross talk distortion canceled.

Although not shown, there can be additional adaptive filters 724 in the first channel 712. The input 722 of each such additional adaptive filter 724 can be connected to a different one of the other carrier signals (other than the first carrier signal 720) but otherwise configured and connected as shown in FIG. 7. Such additional adaptive filters 724 can thus cancel from the first carrier signal 720 distortion (e.g., 810, 812) in the first carrier signal 720 due to cross talk from multiple ones of the other carrier signals.

As shown in FIG. 7, the second channel 714 can similarly include a subtractor 750 (which can be like subtractor 730) and at least one adaptive filter 744 (which can be like adaptive filter 744) with an input 742 connected to one of the carrier signals other than the second carrier signal 740. The output 748 of the adaptive filter 744 can be subtracted by subtractor 750 from the second carrier signal 740. With the output 752 of the subtractor 750 connected to the control input 746 of the adaptive filter 744, the adaptive algorithm (which can be any of the adaptive algorithms referenced above with respect to adaptive filter 724) can cancel the distortion in the second carrier signal 740 that are due to cross talk from the other carrier signal connected to the input 742 of the adaptive filter 744. Multiple such adaptive filters 744 can be connected to multiple ones of the other carrier signals (carriers signals other than the second carrier signal) to similarly cancel distortion (e.g., 808, 812) in the second carrier signal 740 due to cross talk from those other carrier signals.

Still referring to FIG. 7, the ith channel 716 can also include a subtractor 770 (which can be like subtractor 730) and one or more adaptive filters 764 (which can be like adaptive filter 724) each with an input 762 connected to one of the carrier signals other than the ith carrier signal 760. Generally in accordance with the discussions above regarding the first channel 712 and the second channel 714, the output(s) 768 of the adaptive filter(s) 764 can be subtracted by subtractor 770 from the ith carrier signal 760, and the output 772 of the subtractor 770 can be connected to the control input(s) 766 of the adaptive filter(s) 764, which can cancel the distortion (e.g., 808, 810) in the ith carrier signal 760 that are due to cross talk from the other carrier signal(s) connected to the input(s) 762 of the adaptive filter(s) 764.

FIG. 9 illustrates an example in which the receiving module 700' of FIG. 7 has three channels such that the ith channel 716 is the third channel and the ith carrier signal 760 is the third carrier signal. (The ith channel 716 is thus referred to as the third channel 716 and the ith carrier signal 760 is referred to as the third carrier signal 760 when discussing FIG. 9.) Moreover, in the example shown in FIG. 9, each channel 712, 714, and 716 includes an adaptive filter 724, 744, 764 to cancel cross talk distortion from each of the other carrier signals.

As shown, the first channel 712 includes an adaptive filter 724, 724' for each of the other carrier signals 740 and 760 (which are the carrier signals other than the first carrier signal 720). The input 722 of the adaptive filter 724 is connected to the second carrier signal 740, and the input 722' of the adaptive filter 724' is connected to the third carrier signal 760. The subtractor 730 subtracts the outputs 728 and 728' of the adaptive filters 724 and 724' from the first carrier signal 720 as shown in FIG. 9. With the output 732 of the subtractor 730 connected to the control inputs 726 and 726' of the adaptive filters 724 and 724', the combination of the subtractor 730 and the adaptive filters 724 and 724' tends to cancel distortion in the first carrier signal 720 due to cross talk from the second carrier signal 740 and the third carrier signal 760. The output 732 of the subtractor 730 can thus be driven to be a version of the first carrier signal 720 that is substantially free of distortion due to cross talk from the second carrier signal 740 and the third carrier signal 760.

Similarly, the second channel 714 includes an adaptive filter 744, 744' for each of the other carrier signals 720 and 760 (which are the carrier signals other than the second carrier signal 740). The input 742 of the adaptive filter 744 is connected to the first carrier signal 720, and the input 742' of the adaptive filter 744' is connected to the third carrier signal 760. The subtractor 750 subtracts the outputs 748 and 748' of the adaptive filters 744 and 744' from the second carrier signal 740 as shown in FIG. 9, and with the output 752 of the subtractor 750 connected to the control inputs 746 and 746' of the adaptive filters 744 and 744', the combination of the subtractor 750 and the adaptive filters 744 and 744' tends to cancel distortion in the second carrier signal 740 due to cross talk from the first carrier signal 720 and the third carrier signal 760. The output 752 of the subtractor 750 can thus be driven to be a version of the second carrier signal 740 that is substantially free of distortion due to cross talk from the first carrier signal 720 and the third carrier signal 760.

Likewise, the third channel 716 includes an adaptive filter 764, 764' for each of the other carrier signals 720 and 740 (which are the carrier signals other than the third carrier signal 760). The input 762 of the adaptive filter 764 is connected to the first carrier signal 720, and the input 762' of the adaptive filter 764' is connected to the second carrier signal 740. The subtractor 770 subtracts the outputs 768 and 768' of the adaptive filters 764 and 764' from the third carrier signal 760 as shown in FIG. 9. With the output 772 of the subtractor 770 connected to the control inputs 766 and 766' of the adaptive filters 764 and 764', the combination of the subtractor 770 and the adaptive filters 764 and 764' tends to cancel distortion in the third carrier signal 760 due to cross talk from the first carrier signal 720 and the second carrier signal 740. The output 772 of the subtractor 770 can thus be driven to be a version of the second carrier signal 760 that is substantially free of distortion due to cross talk from the first carrier signal 720 and the second carrier signal 740.

The adaptive filters 724 and 724' in FIG. 9 can be implemented like the adaptive filter 400 shown in FIG. 4. That is, each of adaptive filters 724 and 724' can include the controllable filter 402 and adaptive module 410 shown in FIG. 4 discussed above. Implementing adaptive filter 724, the input 404 and output 406 of the of the controllable filter 402, and the desired input 412 and actual input 414 of the adaptive module 410 can be connected in FIG. 9 as follows: the second carrier signal 740 can be connected to the input 404 and the actual signal input 414; the output 406 can be connected as 728 to the subtractor 730; and the output 732 of the subtractor 730 can be connected to the desired signal input 412. Implementing the adaptive filter 724', the input 404 and output 406 of the of the controllable filter 402, and the desired input 412 and actual input 414 of the adaptive module 410 can be connected in FIG. 9 as follows: the third carrier signal 760 can be connected to the input 404 and the actual signal input 414; the output 406 can be connected as 728' to the subtractor 730; and the output 732 of the subtractor 730 can be connected to the desired signal input 412. The adaptive filters 744, 744', 764, and 764' can similarly be implemented like the adaptive filter 400 shown in FIG. 4.

The depiction of the multi-carrier module 700 and 700' in FIGS. 7 and 9 is an example only, and variations are possible. For example, FIGS. 7 and 9 show simplified block diagrams, and the receiving modules 700 and 700' can include additional circuitry, modules, or the like. Moreover, the receiving modules 700 and 700' need not include each of the elements illustrated in FIGS. 1 and 3-6. As another example, although three channels 712, 714, and 716 for three carrier signals 720, 740, and 760 are illustrated, there can be fewer or more channels and carrier signals. As yet another example, the output 736 of the demodulator 734 rather than the output 732 of the subtractor 730 in the first channel 712 can be connected to the control input(s) 724 of the adaptive filter(s) 724. Similarly, the output 756 of the demodulator 754 rather than the output 752 of the subtractor 750 in the second channel 714 can be connected to the control input(s) 744 of the adaptive filter(s) 744, and the output 776 of the demodulator 774 rather than the output 772 of the subtractor 770 in the ith channel 714 (or the third channel 716 in FIG. 9) can be connected to the control input(s) 766 of the adaptive filter(s) 764. It is also noted that each of the elements in FIGS. 7 and 9 can be implemented in hardware circuitry, software, or a combination of hardware and software.

Figure 10:
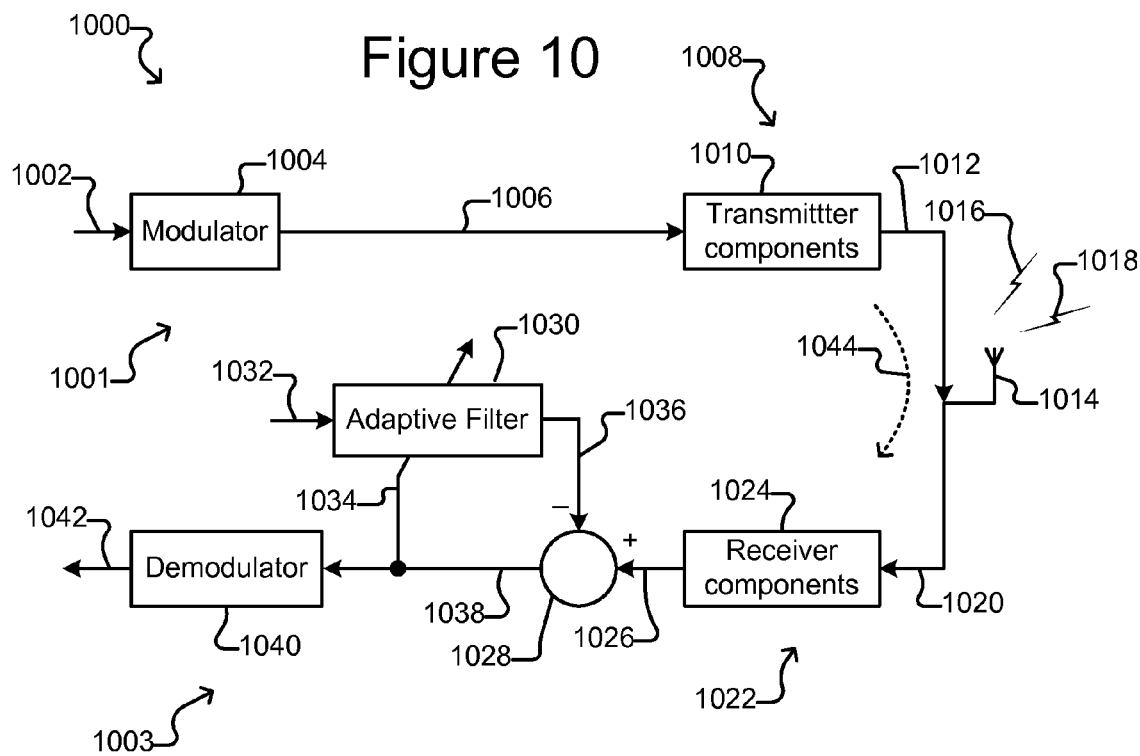
FIG. 10 illustrates an example of an RF transceiver that uses adaptive filtering to cancel from a received RF signal distortion arising from leakage of a transmit signal into the receive path according to some embodiments of the invention.

Turning next to FIG. 10, it is noted that FIG. 10 shows an example of an RF transceiver 1000 that uses adaptive filtering to cancel from a received RF signal distortion arising from leakage of a transmit signal into the receive path. As is known, an RF transceiver is a device that is capable of both transmitting and receiving RF signals. As such, the RF transceiver 1000 of FIG. 10 can include an RF transmitter 1001 and an RF receiver 1003.

The RF transmitter 1001 can include an RF modulator 1004, which can receive data 1002 as input and modulate the data 1002 onto a carrier signal. The modulator 1004 and the data 1002 can be generally like the modulator 104 and data 102 discussed above with respect to FIG. 1. The modulator 1004 can output a modulated carrier signal 1006. As also shown in FIG. 10, the transmitter 1001 can also include a transmission path 1008, which can comprise transmitter components 1010 and a transmitting/receiving mechanism 1014. Directed through the transmission path 1008, the modulated carrier signal 1006 can be radiated by the transmitting/receiving mechanism 1014 as a transmitted signal 1016 into a transmission medium where it can be received by a different RF receiving device (not shown in FIG. 10), which can be remotely located.

The transmitter components 1010 can be the same as or similar to the transmitter components 116 of FIG. 1 and can include any of the components mentioned above with respect to the transmitter components 116 of FIG. 1. The transmission medium into which the transmitted signal 1016 is transmitted can be any suitable medium for RF signals including, without limitation, free space, ambient air, a cable, a telephone line, a fiber optic cable, or the like. The transmitting/receiving mechanism 1014 can be any mechanism suitable for transmitting the RF signal 1016 into the transmission medium and, as will be discussed, receiving an incoming RF signal 1018. The transmitting/receiving mechanism 1014 can comprise a single apparatus for transmitting and receiving RF signals, or the transmitting/receiving mechanism 1014 can comprise one device for transmitting RF signals and another device for receiving RF signals. Regardless, examples of a suitable transmitting/receiving mechanism 1014 include an RF antenna, a modem (e.g., a cable modem, a telephone line modem, a fiber optic modem), or the like.

The RF receiver 1003 can include the transmitting/receiving mechanism 1014 and a receive path 1022, which can comprise the transmitting/receiving mechanism 1014 and receiver components 1024. That is, an incoming RF signal 1018 (which can be an RF signal transmitted by a different RF device (not shown) remotely located from the transceiver 1000) can be received by the transmitting/receiving mechanism 1014 and provided as a received RF signal 1020 to the receiver components 1024. The receiver components 1024 can include such elements as one or more analog-to-digital converters, digital-to-analog converters, decoders, down converters, amplifiers, filters (e.g., band-pass filters), and/or the like. As shown, the receiver 1003 can also include a demodulator 1040 for demodulating the received RF signal to produce data 1042 in the RF signal 1018.

Figure 11:
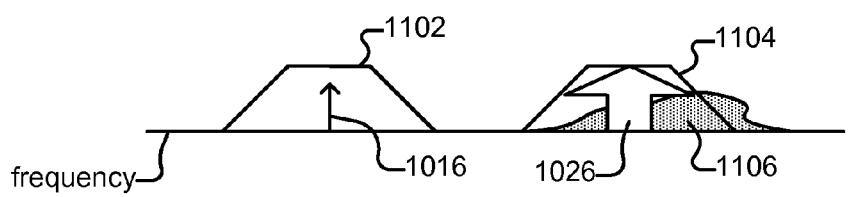
FIG. 11 shows examples of frequency pass-bands of the transmitter and receiver of the RF transceiver of FIG. 10 with an example of distortion due to leakage of a transmit signal into the receive path.

Typically, the carrier signal of the transmitted RF signal 1016 is in a different frequency band than the carrier signal of the incoming RF signal 1018. For example, as illustrated in FIG. 11, the transmitted signal 1016 can have a frequency in a transmission pass-band 1102 that is spaced apart from (and thus does not overlap) the pass-band 1104 of the incoming signal 1018. Band-pass filtering (not shown) in the transmitter components 1010 can remove frequencies from the RF signal to be transmitted 1012 so that the transmitted signal 1016 does not include frequencies outside the pass-band 1102.

All or part of the modulated RF signal 1006 or 1012 can nevertheless leak from the transmitter 1001 into the receiver 1003. For example, all or part of the RF signal 1006 or 1012 can leak from the transmission path 1008 into the receive path 1022. Such a leaked transmission signal is labeled 1044 in FIG. 10. The received RF signal 1020 or 1026 can thus include distortion in the arising from a leaked transmission signal 1044.

As noted, the receiver components 1024 can include a band-pass filter (not shown) that substantially filters out (i.e., removes) frequencies from the received signal 1020 that are outside the pass-band 1104 of the of the band-pass filter (not shown) in the receiver components 1024. Distortion, including distortion arising from the leaked transmission signal 1044, with frequencies outside the pass-band 1104 of the band-pass filter (not shown) in the receiver components 1024 can thus be removed from the signal 1026 output by the receiver components 1024. The leaked transmission signal 1044 can, however, cause in-band distortion, that is, distortion with frequencies inside the pass-band 1104 of the band-pass filter (not shown) in the receiver components 1024. For example, distortion 1106 (which can include linear and/or non-linear distortion) in FIG. 11 is inside the pass-band 1104 and thus will not be removed by band-pass filtering in the receiver components 1024.

As shown in FIG. 10, the receiver 1003 can include a subtractor 1028 and an adaptive filter 1030 configured in an adaptive noise cancellation configuration to substantially cancel the distortion 1106 caused by the leaked transmission signal 1044. As shown, an approximated distortion signal 1032 approximating the leaked transmission signal 1044 can be provided as the input to the adaptive filter 1030, and the output 1036 of the adaptive filter 1030 can be subtracted by the subtractor 1028 from the received signal 1026. The output 1038 of the subtractor 1028 can be provided as the control input 1034 to the adaptive filter 1030. The adaptive module of the adaptive filter 1030 can be configured to cancel the distortion (e.g., the distortion 1106 in FIG. 11) in the received signal 1026 (which can be a wideband signal in some embodiments) that is due to the leaked transmission signal 1044. Suitable adaptive algorithms for doing so include those identified above. The output 1038 of the subtractor 1028 can thus be the received signal 1026 with distortion (e.g., 1106 in FIG. 11) caused by the leaked transmission signal 1044 substantially canceled.

The approximated distortion signal 1032 that approximates the leaked transmission signal 1044 and is provided as input to the adaptive filter 1030 in FIG. 10 can be obtained in any suitable manner.

Figure 12:
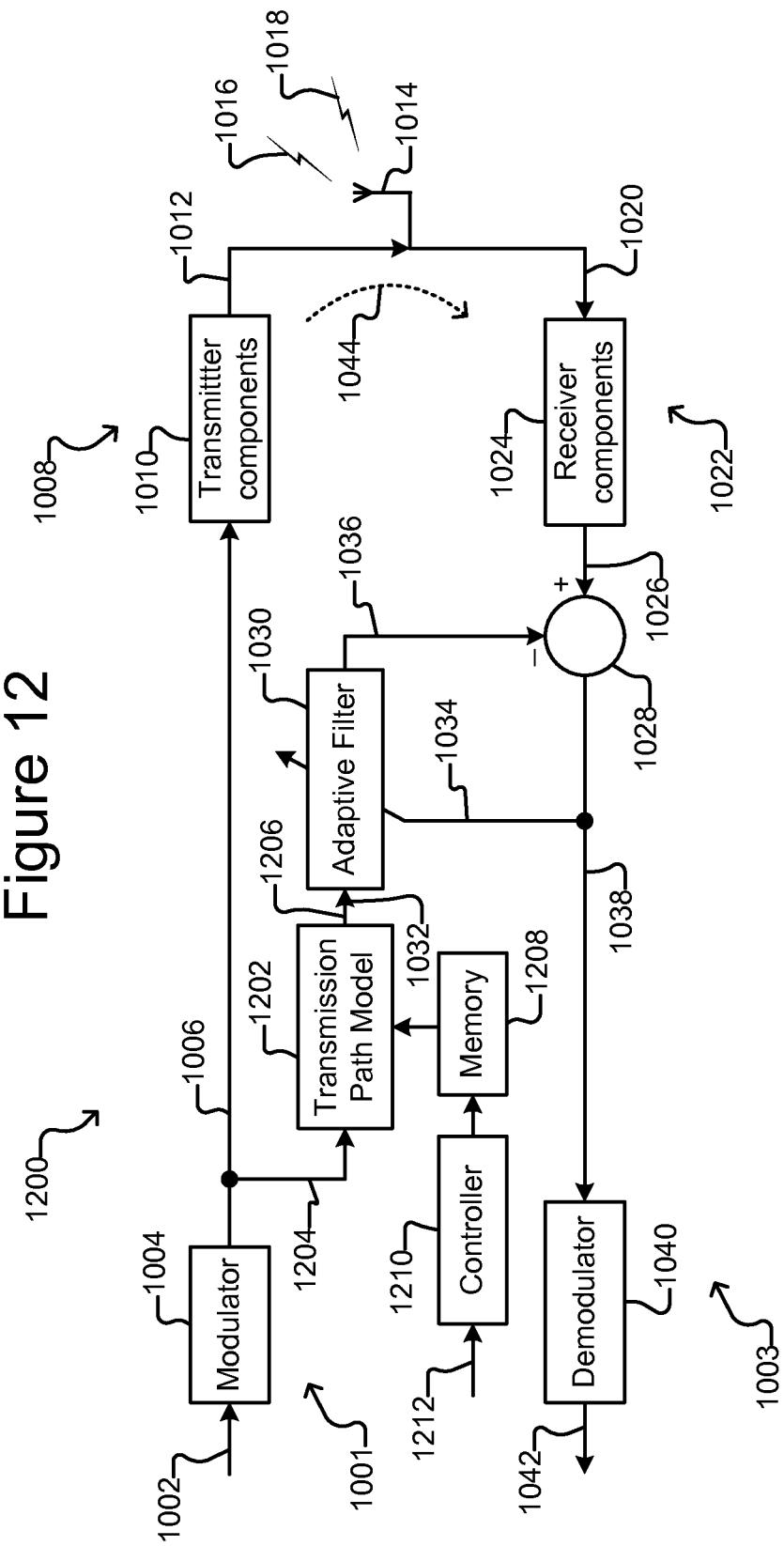
FIG. 12 illustrates an example of the RF transceiver of FIG. 10 in which the approximated distortion signal for controlling the adaptive filter of FIG. 10 is provided by a model of the transmission path of the transmitter of the RF transceiver according to some embodiments of the invention.

FIG. 12 illustrates an example configuration 1200 of the transceiver 1000 of FIG. 10 that includes a transmission path model 1202 that is a model of all or part of the transmission path 1008 (which as noted can include transmitter components 1010 and the transmitting/receiving mechanism 1014) for providing the approximated distortion signal 1032 according to some embodiments of the invention. The transceiver 1200 of FIG. 12 thus represents on example configuration of the transceiver 1000 of FIG. 10 in which the approximated distortion signal 1032 is provided by a transmission path model 1202.

As shown in FIG. 12, the modulated carrier signal 1006 can be provided to an input 1204 of the transmission path model 1202. The transmission path model 1202 can model all or part of the transmission path 1008 and can thus provide at its output 1206 a signal that approximates the carrier signal 1006 after passing through all or part of the transmission path 1008. The output 1206 of the transmission path model 1202 can thus approximate the leaked transmission signal 1044 and can thus be the approximated distortion signal 1032 provided to the input of the adaptive filter 1030 as shown in FIG. 12.

The transmission path model 1202 can be generally the same as or similar to the transmission path model 302 discussed above with respect to FIG. 3. For example, the transmission path model 1202 can be a computer-generated model of all or part of the transmission path 1008. As another example, the transmission path model 1202 can be obtained from tests of the transmission path 1008 in a laboratory. Regardless, the transmission path model 1202 can model both linear and non-linear characteristics of the transmission path 1008.

Similar to the module 300 shown in FIG. 3, the transceiver 1200 of FIG. 12 can also include an electronic memory 1208 (which can be the same as or similar to the memory 308 in FIG. 3) and a controller 1210 (which can be the same as or similar to the controller 310 in FIG. 3). Generally in accordance with the discussion above of memory 308 and control 310 in FIG. 3, multiple versions of the transmission path model 1202 can be stored in the memory 1208, and the controller 1210 can select any of the versions of the transmission path model 1202 for use at any given time during operation of the transmitting device 1200. For example, each version of the transmission path model 1202 stored in the memory 1208 can correspond to a different operating condition or conditions of the transmitting device 1200, and the controller 1210 can be configured to select and change, as needed, the version of the transmission path model 1202 in memory 1208 in accordance with the current condition or conditions of the transmitting device 1200. The controller 1210 can thus change the version of the transmission path model 1202 used to generated the approximated distortion signal 1032 based on changing conditions of the transmitting device 1200. An input 1212 of the controller 1210 can be connected, for example, to a sensor (not shown) that senses a current condition or conditions of the transmitting device 1200. Alternatively or in addition, the input 1212 can allow a human operator to control the controller 1210.

Again generally in accordance with the discussion above of transmission path model, 302, memory 308, and controller 310 in FIG. 3, each version of the transmission path model 1202 stored in the memory 1208 can correspond to, for example, a different operating temperature of the transmission path 1008. A temperature sensing device (not shown) can be connected to the control input 1212 of the controller 1210. The controller 1210 can be configured to select the version of the transmission path model 1202 from the memory 1208 that corresponds to the current operating temperature, and the controller 1210 can be further configured to change the selected version of the transmission path model 1202 as the operating temperature changes.

The adaptive filter 1030 in FIG. 12 can be implemented like the adaptive filter 400 shown in FIG. 4. That is, the adaptive filter 1030 can include the controllable filter 402 and adaptive module 410 shown in FIG. 4 and discussed above. The input 404 and output of the controllable filter 402, and the desired input 412 and actual input 414 of the adaptive module 410 can be connected in FIG. 12 as follows: the output 1206 of the transmission path model 1202 can be connected to the input 404 and the actual signal input 414; the output 406 can be connected as 1036 to the subtractor 1028; and the output 1038 of the subtractor 1028 can be connected to the desired signal input 412.

Figure 13:
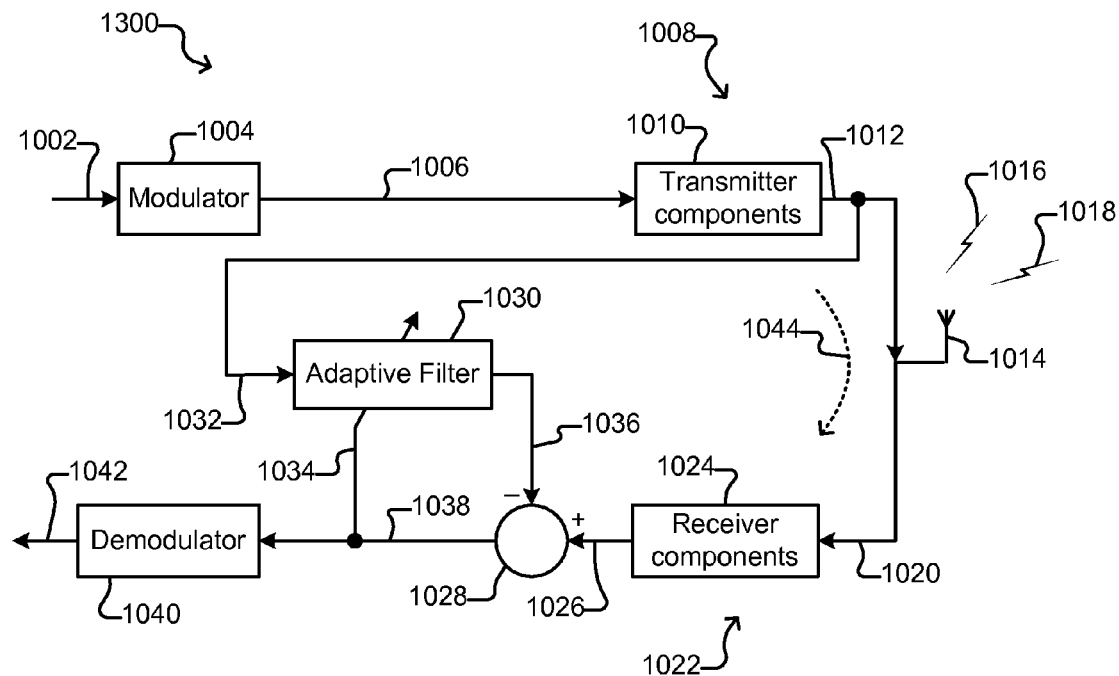
FIG. 13 illustrates an example of the RF transceiver of FIG. 10 in which the approximated distortion signal for controlling the adaptive filter of FIG. 10 is provided by a feedback from the transmission path of the transmitter of the RF transceiver according to some embodiments of the invention.
Figure 14:
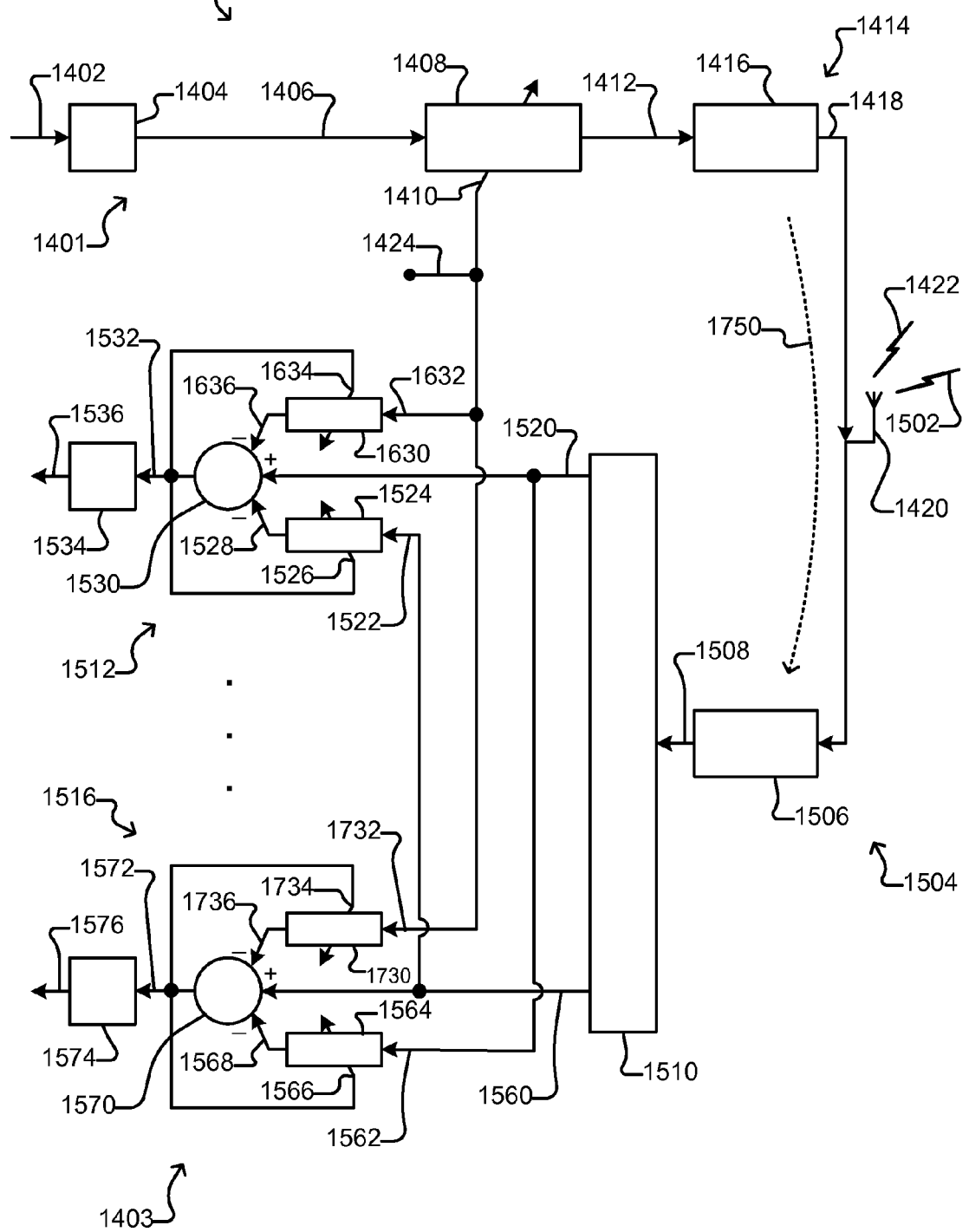
FIG. 14 shows an example of an RF transceiver in which adaptive filtering is utilized to pre-compensate an RF signal to cancel transmission path distortion from the RF signal, cancel from a given carrier signal distortion due to cross talk from adjacent carrier signals, and cancel from a received RF signal distortion arising from leakage of a transmit signal into the receive path according to some embodiments of the invention.

FIG. 13 illustrates an example 1300 of the transceiver 1000 of FIG. 10 in which the signal 1012 is fed back from the transmission path 1008 and provided as the approximated distortion signal 1032 input to the adaptive filter 1030 according to some embodiments of the invention. The signal 1012 fed back as shown in FIG. 13 is thus another example of an approximated distortion signal 1032 that can be provided as input to the adaptive filter 1030. The transmitting module 1300 of FIG. 13 thus represents an example configuration of the transmitting module 1000 of FIG. 10 in which the approximated distortion signal 1032 is provided by a feedback signal from the transmission path 1008.

The adaptive filter 1030 in FIG. 13 can also be implemented like the adaptive filter 400 shown in FIG. 4. That is, the adaptive filter 1030 can include the controllable filter 402 and adaptive module 410 shown in FIG. 4 and discussed above. The input 404 and output of the of the controllable filter 402, and the desired input 412 and actual input 414 of the adaptive module 410 can be connected in FIG. 13 as follows: the feedback of signal 1012 from the transmission path 1008 can be connected to the input 404 and the actual signal input 414; the output 406 can be connected as 1036 to the subtractor 1028; and the output 1038 of the subtractor 1028 can be connected to the desired signal input 412.

The examples illustrated in FIGS. 10-13 are examples only, and variations are possible. For example, FIGS. 10, 12, and 13 show simplified block diagrams, and any of the transceivers 1000, 1200, and 1300 can include additional circuitry, modules, or the like. Moreover, the transceivers 1000, 1200, and 1300 need not include each of the elements illustrated in FIGS. 10, 12, and 13. As another example, the carrier signal 1006 can be a multi-carrier signal that is a combination of multiple modulated carrier signals each having a different frequency. It is also noted that each of the elements in FIGS. 10, 12, and 13 can be implemented in hardware circuitry, software, or a combination of hardware and software.

Two or more of the techniques for canceling distortion in RF signals discussed above can be used in combination in the same RF device. FIG. 14 illustrates an example in which adaptive filtering is used to pre-compensate an RF signal to cancel transmission path distortion from an RF signal to be transmitted (see FIGS. 1-6), adaptive filtering is used to cancel from a given carrier signal distortion due to cross talk from adjacent carrier signals in a received multicarrier RF signal (see FIGS. 7-9), and adaptive filtering is used to cancel from a received RF signal distortion arising from leakage of a transmit signal into the receiver path (see FIGS. 10-13).

As shown in FIG. 14, an RF transceiver 1400 can include a transmitter 1401 and a receiver 1403. The transmitter 1401 can include a modulator 1404, an adaptive filter 1408, and a transmission path 1414 (which can include transmission components 1416 (which can be the same as or similar to the transmission components 116 of FIG. 1) and a transmitting/receiving device 1420). The modulator 1404, adaptive filter 1408, and transmission path 1414 can function and be the same as or similar to the modulator 104, adaptive filter 108, and transmission path 114 of FIG. 1 as described above including variations and examples illustrated in FIGS. 2-6, and the transmitting/receiving device 1420 can function and be the same as or similar to the transmitting/receiving device 1020 in FIG. 10. That is, the modulator 1404 can modulate data 1402 into a carrier signal and output a modulated carrier signal 1406. The modulated carrier signal 1406 can be filtered by an adaptive filter 1408 under control of a control signal 1424 at a control input 1410 of the adaptive filter 1408. The control signal 1424 can be the same as or similar to control signal 124 of FIG. 1 as described above. That is, can be an estimated or approximated version of the modulated carrier signal 1406 distorted with the inherent path distortion of the transmission path 1414.

The adaptive filter 1408 can function and be the same as or similar to the adaptive filter 108 in FIG. 1 as discussed above. That is, the adaptive filter 1408 can be configured and operated to pre-compensate the modulated carrier signal 1406 with an inverse of the inherent path distortion imparted by the transmission path 1414. The pre-compensated signal 1412 output by the adaptive filter 1408 thus includes inverse distortion that cancels the inherent path distortion imparted to the signal 1412 by the transmission path 1414. The transmitted signal 1422 can thus be substantially free of the inherent path distortion imparted by the transmission path 1414. The transmitter 1401 can thus implement the use of adaptive filtering to pre-compensate an RF signal to be transmitted to cancel transmission path distortion from the transmitted RF signal illustrated in and discussed above with respect to FIGS. 1-6.

The receiver 1403 can be a multi-carrier receiver, which can be generally similar to or the same as the multi-carrier receivers 700 and 700' illustrated in and discussed above with respect to FIGS. 7-9. As shown, the transmitter 1403 can include a receive path 1504 comprising the transmitting/receiving mechanism 1420 and receiver components 1506. The receive path 1504 can function and be the same as or similar to receive path 1022 in FIG. 10. That is, an incoming multi-carrier signal 1502 can be received by the transmitting/receiving mechanism 1420 and processed by the receiver components 1506 to produce a received multi-carrier signal 1508. The receiver components 1506 can function and be the same as or similar to the receiver components 706 of FIG. 7 as described above, and the multi-carrier signal 1508 can be the same as or similar to the multi-carrier signal 708 of FIG. 7 as described above.

As also shown in FIG. 14, the multi-carrier receiver 1403 can include a channelizer 1510 and a plurality of channels 1512 (a first channel), 1516 (an ith channel), which can function and be the same as or similar to the channelizer 710 and channels 712, 714, 716 in FIGS. 7 and 9 as described above. (There can be i minus 2 number of additional channels between the first channel 1512 and the ith channel 1516.) That is, the channelizer 1510 can separate the multi-carrier signal 1508 into its constituent carrier signals 1520 (a first carrier signal), 1560 (an ith carrier signal), which can be like any of carrier signals 720, 740, 760 generally as discussed above with respect to FIGS. 7-9. (The multicarrier signal 1508 can have i minus 2 number of additional carrier signals the first carrier signal 1520 and the ith carrier signal 1560.)

The first channel 1512 can include a subtractor 1530 and an adaptive filter 1524 having an input 1522, and output 1528, and a control input 1526. The subtractor 1530 can function and be the same as or similar to the subtractor 730 in FIGS. 7 and 9 as described above, and the adaptive filter 1524 can function and be the same as or similar to the adaptive filter 724 in FIGS. 7 and 9 as described above. That is, the ith carrier signal 1560 can be provided to the input 1522 of the adaptive filter 1524, and the subtractor 1530 can subtract the output 1528 of the adaptive filter 1524 from the first carrier signal 1520. And the output 1532 of the subtractor 1530 can be fed back to the control input 1526 of the adaptive filter 1524, which can vary the filtering characteristics of the adaptive filter 1524 such that the output 1532 of the subtractor 1530 converges on the first carrier signal 1520 absent cross talk distortion from the ith carrier signal 1560. The first channel 1512 can similarly include additional adaptive filters 1524 with their inputs connected to other carrier signals (any or all of the carrier signals between the first carrier signal 1520 and the ith carrier signal 1560) to cancel cross talk in the first carrier signal 1520 due to cross talk for the other carrier signals generally as discussed above with respect to FIGS. 7-9.

The ith channel 1516 can similarly include a subtractor 1570 and an adaptive filter 1564 having an input 1562, an output 1568, and a control input 1566. The subtractor 1570 can function and be the same as or similar to the subtractor 770 in FIGS. 7 and 9 as described above, and the adaptive filter 1564 can function and be the same as or similar to the adaptive filter 764 in FIGS. 7 and 9 as described above. That is, the first carrier signal 1520 can be provided to the input 1562 of the adaptive filter 1564, and the subtractor 1570 can subtract the output 1568 of the adaptive filter 1564 from the ith carrier signal 1560. The output 1572 of the subtractor 1570 can be fed back to the control input 1566 of the adaptive filter 1564, which can vary the filtering characteristics of the adaptive filter 1564 such that the output 1572 of the subtractor 1570 converges on the ith carrier signal 1560 absent cross talk distortion from the first carrier signal 1520. The ith channel 1516 can similarly include additional adaptive filters 1564 with their inputs connected to other carrier signals (any or all of the carrier signals between the first carrier signal 1520 and the ith carrier signal 1560) to cancel cross talk in the ith carrier signal 1560 due to cross talk for the other carrier signals generally as discussed above with respect to FIGS. 7-9.

Each carrier signal 1520 to 1560 can thus be substantially free of the distortion imparted by cross talk from the other carrier signal(s). The receiver 1403 can thus implement the use of adaptive filtering to cancel cross talk distortion from the carriers separated from a received multi-carrier signal 1508 as illustrated in and discussed with respect to FIGS. 7-9 above.

As shown in FIG. 14, the receiver 1403 can also include an adaptive filter 1630, 1730 in each channel 1512, 1516 to cancel distortion in each of the carrier signals 1520, 1560 arising from a leaked transmission signal 1750 (which can be the same as or similar to the leaked transmission signal 1044) from the transmission path 1414 into the receive path 1504 generally as discussed above with respect to FIGS. 10-13.

For example, the receiver 1403 can also include an adaptive filter 1630 having an input 1632, an output 1636, and a control input 1634. The adaptive filter 1630 can function and be the same as or similar to the adaptive filter 1030 in FIGS. 10, 12, and 13 as described above. That is, the control signal 1424 (which can be the same as the approximated distortion signal 1032 discussed above with respect to FIGS. 10-13) can be provided as input 1632 to the adaptive filter 1630, and the output 1636 can be subtracted by the subtractor 1530 from the first carrier signal 1520. The output 1532 of the subtractor 1530 can be fed back to the control input 1634 of the adaptive filter 1630, which can vary the filtering characteristics of the adaptive filter 1630 such that the output 1532 of the subtractor 1530 converges on the first carrier signal 1520 absent distortion from the leaked transmission signal 1750 (which can be the same as or similar to the transmit signal leakage 1044 in FIGS. 10, 12, and 13 as described above) from the first carrier signal 1520. The receiver 1403 can thus implement the use of adaptive filtering to cancel distortion in the first carrier signal 1520 that arises from the leaked transmission signal 1750 from the transmission path 1414 into the receive path 1504 generally as illustrated in and discussed above with respect to FIGS. 10-13.

The receiver 1403 can also include an adaptive filter 1730 having an input 1732, an output 1736, and a control input 1734. The adaptive filter 1730 can function and be the same as or similar to the adaptive filter 1030 in FIGS. 10, 12, and 13 as described above. That is, the control signal 1424 (which can be the same as the approximated distortion signal 1032 discussed above with respect to FIGS. 10-13) can be provided as input 1732 to the adaptive filter 1730, and the output 1736 can be subtracted by the subtractor 1570 from the ith carrier signal 1560. The output 1572 of the subtractor 1570 can be fed back to the control input 1734 of the adaptive filter 1730, which can vary the filtering characteristics of the adaptive filter 1730 such that the output 1572 of the subtractor 1570 converges on the ith carrier signal 1560 absent distortion from the leaked transmission signal 1750 (which can be the same as or similar to the transmit signal leakage 1044 in FIGS. 10, 12, and 13 as described above) from the ith carrier signal 15260. The receiver 1403 can thus implement the use of adaptive filtering to cancel distortion in the ith carrier signal 1560 that arises from the leaked transmission signal 1750 from the transmission path 1414 into the receive path 1504 generally as illustrated in and discussed above with respect to FIGS. 10-13 above.

The example illustrated in FIG. 14 is an example only, and variations are possible. For example, FIG. 14 shows simplified block diagrams, and the transceiver 1400 can include additional circuitry, modules, or the like. Moreover, the transmitting device 1400 need not include each of the elements illustrated in FIG. 14. As another example, the carrier signal 1406 can be a multi-carrier signal that is a combination of multiple modulated carrier signals each having a different frequency. It is also noted that each of the elements in FIG. 14 can be implemented in hardware circuitry, software, or a combination of hardware and software.

Although specific embodiments and applications of the invention have been described in this specification, these embodiments and applications are exemplary only, and many variations are possible.

We claim:

1. A radio frequency (RF) transceiver comprising:
   an RF transmitter that generates a distortion signal for a transmission path of the RF transmitter, the distortion signal representing a leaked transmission signal from the RF transmitter;
   an RF receiver configured to receive a multicarrier RF signal comprising a plurality of carrier signals each having a frequency within a different frequency pass-band;
   a channelizer configured to receive the multicarrier RF signal and separate each of the plurality of carrier signals from the multicarrier RF signal;
   a plurality of RF channels each configured for one of the plurality of carrier signals, each RF channel comprising:
      a subtractor having a first input, a second input, a third input, and an output, the first input receiving the carrier signal for the RF channel;
      a first adaptive filter having an input, an output, and a control input, the control input being coupled to the output of the subtractor, the input receiving the carrier signal of another RF channel such that the output provides a version of the carrier signal of the other RF channel that has been filtered in accordance with the output of the subtractor; and
      a second adaptive filter having an input, an output, and a control input, the control input being coupled to the output of the subtractor, the input receiving the distortion signal such that the output provides a version of the distortion signal that has been filtered in accordance with the output of the subtractor;
      wherein the subtractor subtracts the version of the carrier signal of the other RF channel and the version of the distortion signal from the carrier signal for the RF channel to thereby remove intermodulation distortion caused by the carrier signal of the other RF channel and to remove interference caused by the leaked transmission signal.

2. The transceiver of claim 1, wherein the first adaptive filter is a non-linear filter.

3. The transceiver of claim 1, wherein each of the plurality of RF channels further comprises:
   at least one additional adaptive filter, each additional adaptive filter having an input, an output, and a control input, the control input being coupled to the output of the subtractor, the input receiving the carrier signal of an additional RF channel such that the output provides a version of the carrier signal of the additional RF channel that has been filtered in accordance with the output of the subtractor;
   wherein the subtractor includes an additional input for each of the at least one additional adaptive filter.

4. The transceiver of claim 1, wherein each of the plurality of RF channels further comprises:
   an adaptive filter for each of the other RF channels.

5. The transceiver of claim 1, wherein the RF transmitter includes a transmission path model which produces the distortion signal.

6. The receiving module of claim 5, wherein the RF transmitter includes a plurality of versions of the transmission path model each of which corresponds to a different operating condition of the RF transmitter.

7. The receiving module of claim 1, wherein the distortion signal is a transmission signal that has been transmitted through the transmission path of the RF transmitter.

8. A process of cancelling cross-talk distortion from a carrier signal in a radio frequency (RF) receiving module comprising:
   generating, at an RF transmitter, a distortion signal for a transmission path of the RF transmitter, the distortion signal representing a leaked transmission signal from the RF transmitter;
   receiving a multicarrier RF signal comprising a plurality of carrier signals each having a frequency within a different frequency pass-band;
   separating the multicarrier RF signal into each of the plurality of carrier signals;
   for each carrier signal, providing an RF channel comprising:
      a subtractor having a first input, a second input, a third input, and an output, the first input receiving the carrier signal for the RF channel;
      a first adaptive filter having an input, an output, and a control input, the control input being coupled to the output of the subtractor, the input receiving the carrier signal of another RF channel such that the output provides a version of the carrier signal of the other RF channel that has been filtered in accordance with the output of the subtractor; and
      a second adaptive filter having an input, an output, and a control input, the control input being coupled to the output of the subtractor, the input receiving the distortion signal such that the output provides a version of the distortion signal that has been filtered in accordance with the output of the subtractor; and
   employing the subtractor to subtract the version of the carrier signal of the other RF channel and the version of the distortion signal from the carrier signal for the RF channel to thereby remove intermodulation distortion caused by the carrier signal of the other RF channel and to remove interference caused by the leaked transmission signal.

9. The process of claim 8, wherein the first adaptive filter is a non-linear filter.

10. The process of claim 8, wherein each of the plurality of RF channels further comprises:
    at least one additional adaptive filter, each additional adaptive filter having an input, an output, and a control input, the control input being coupled to the output of the subtractor, the input receiving the carrier signal of an additional RF channel such that the output provides a version of the carrier signal of the additional RF channel that has been filtered in accordance with the output of the subtractor;
    wherein the subtractor includes an additional input for each of the at least one additional adaptive filter such that the subtractor also subtracts the version of the carrier signal of each corresponding additional RF channel.

11. The process of claim 8, wherein each of the plurality of RF channels further comprises:
    an adaptive filter for each of the other RF channels.

12. The process of claim 8, wherein the RF transmitter includes a transmission path model which produces the distortion signal.

13. The process of claim 12, wherein the RF transmitter includes a plurality of versions of the transmission path model each of which corresponds to a different operating condition of the RF transmitter.

14. The process of claim 8, wherein the distortion signal is a transmission signal that has been transmitted through the transmission path of the RF transmitter.

\* \* \* \* \*